(12) United States Patent  
Narendran et al.

(10) Patent No.: US 7,819,549 B2  
(45) Date of Patent: Oct. 26, 2010

(54) HIGH EFFICIENCY LIGHT SOURCE USING SOLID-STATE EMITTER AND DOWN-CONVERSION MATERIAL

(75) Inventors: Nadarajah Narendran, Clifton Park, NY (US); Yimin Gu, Troy, NY (US); Jean Paul Freyssinier, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 22 days.

(21) Appl. No.: 10/583,105

(22) PCT Filed: May 5, 2005

(86) PCT No.: PCT/US2005/015736

§ 371 (c)(1), (2), (4) Date: Apr. 23, 2007

(87) PCT Pub. No.: WO2005/107420

PCT Pub. Date: Nov. 17, 2005

(65) Prior Publication Data

US 2008/0030993 A1    Feb. 7, 2008

Related U.S. Application Data

(60) Provisional application No. 60/636,123, filed on Dec. 15, 2004, provisional application No. 60/568,373, filed on May 5, 2004.

(51) Int. Cl.  
*F21K 2/08* (2006.01)

(52) U.S. Cl. .................. 362/228; 362/84; 362/222; 362/225

(58) Field of Classification Search .............. 362/228, 362/26, 27, 555, 558, 560, 582, 235, 222, 362/225, 293, 329, 330, 84; 33/265; 313/512, 313/498, 501; 42/123, 131, 132, 145

See application file for complete search history.

(56) References Cited

U.S. PATENT DOCUMENTS 2,933,602 A * 4/1960 Gillson, Jr. ............... 250/484.2

(Continued)

FOREIGN PATENT DOCUMENTS

DE    3632743 A1    3/1988

(Continued)

OTHER PUBLICATIONS

Akos Borbely, et al., Prediction of Light Extraction Efficiency of LEDs by Ray Trace Simulation, Third International Conference on Solid State LIghting, Proc. of SPIE vol. 5187, pp. 301-308 (2004).

(Continued)

*Primary Examiner*—Sharon E Payne  
(74) *Attorney, Agent, or Firm*—RatnerPrestia

(57) ABSTRACT

A light emitting apparatus includes a source of light for emitting light; a down conversion material receiving the emitted light, and converting the emitted light into transmitted light and backward transmitted light; and an optic device configured to receive the backward transmitted light and transfer the backward transmitted light outside of the optic device. The source of light is a semiconductor light emitting diode, a laser diode (LD), or a resonant cavity light emitting diode (RCLED). The down conversion material includes one of phosphor or other material for absorbing light in one spectral region and emitting light in another spectral region. The optic device, or lens, includes light transmissive material.

40 Claims, 11 Drawing Sheets

U.S. PATENT DOCUMENTS

| | | | |
|---|---|---|---|
| 3,555,337 A | 1/1971 | Faria et al. | |
| 3,581,137 A | 5/1971 | Arnott et al. | |
| 3,593,055 A | 7/1971 | Geusic et al. | |
| 3,760,237 A | 9/1973 | Jaffe | |
| 3,763,405 A | 10/1973 | Mitsuhata | |
| 3,875,456 A | 4/1975 | Kano et al. | |
| 4,729,076 A | 3/1988 | Masami et al. | |
| 5,097,175 A * | 3/1992 | Thomas | 313/461 |
| 5,187,765 A | 2/1993 | Muehlemann et al. | |
| 5,208,462 A | 5/1993 | O'Connor et al. | |
| 5,461,547 A | 10/1995 | Ciupke et al. | |
| 5,477,430 A | 12/1995 | LaRose | |
| 5,499,138 A | 3/1996 | Iba | |
| 5,535,230 A | 7/1996 | Abe | |
| 5,622,423 A | 4/1997 | Lee | |
| 5,711,594 A | 1/1998 | Hay | |
| 5,777,433 A | 7/1998 | Lester et al. | |
| 5,808,409 A | 9/1998 | Matsuda et al. | |
| 5,813,752 A * | 9/1998 | Singer et al. | 362/293 |
| 5,813,753 A | 9/1998 | Vriens et al. | |
| 5,847,507 A | 12/1998 | Butterworth et al. | |
| 5,959,316 A | 9/1999 | Lowery | |
| 5,962,971 A | 10/1999 | Chen | |
| 5,998,925 A | 12/1999 | Shimizu et al. | |
| 6,007,209 A | 12/1999 | Pelka | |
| 6,066,861 A | 5/2000 | Höhn et al. | |
| 6,068,383 A | 5/2000 | Robertson et al. | |
| 6,069,440 A | 5/2000 | Shimizu et al. | |
| 6,084,250 A | 7/2000 | Jüstel et al. | |
| 6,096,496 A | 8/2000 | Frankel | |
| 6,155,699 A | 12/2000 | Miller et al. | |
| 6,210,012 B1 | 4/2001 | Broer | |
| 6,245,259 B1 | 6/2001 | Höhn et al. | |
| 6,252,254 B1 | 6/2001 | Soules et al. | |
| 6,294,800 B1 | 9/2001 | Duggal et al. | |
| 6,350,041 B1 | 2/2002 | Tarsa et al. | |
| 6,357,889 B1 | 3/2002 | Duggal et al. | |
| 6,385,855 B1 | 5/2002 | Tymianski | |
| 6,452,217 B1 | 9/2002 | Wojnarowski et al. | |
| 6,469,322 B1 | 10/2002 | Srivastava et al. | |
| 6,483,196 B1 | 11/2002 | Wojnarowski et al. | |
| 6,491,412 B1 | 12/2002 | Bowman et al. | |
| 6,501,102 B2 | 12/2002 | Mueller-Mach et al. | |
| 6,513,949 B1 | 2/2003 | Marshall et al. | |
| 6,576,930 B2 | 6/2003 | Reeh et al. | |
| 6,576,935 B2 | 6/2003 | Onishi et al. | |
| 6,580,097 B1 | 6/2003 | Soules et al. | |
| 6,580,224 B2 | 6/2003 | Ishii et al. | |
| 6,600,175 B1 | 7/2003 | Baretz et al. | |
| 6,603,258 B1 | 8/2003 | Mueller-Mach et al. | |
| 6,608,332 B2 | 8/2003 | Shimizu et al. | |
| 6,614,170 B2 | 9/2003 | Wang et al. | |
| 6,614,179 B1 | 9/2003 | Shimizu et al. | |
| 6,616,862 B2 | 9/2003 | Srivastava et al. | |
| 6,630,691 B1 | 10/2003 | Mueller-Mach et al. | |
| 6,635,363 B1 | 10/2003 | Duclos et al. | |
| 6,635,987 B1 | 10/2003 | Wojnarowski et al. | |
| 6,653,765 B1 | 11/2003 | Levinson et al. | |
| 6,686,676 B2 | 2/2004 | McNulty et al. | |
| 6,686,691 B1 | 2/2004 | Mueller et al. | |
| 6,692,136 B2 | 2/2004 | Marshall et al. | |
| 6,696,703 B2 | 2/2004 | Mueller-Mach et al. | |
| 6,791,259 B1 | 9/2004 | Stokes et al. | |
| 6,793,374 B2 | 9/2004 | Begemann | |
| 6,796,690 B2 | 9/2004 | Bohlander | |
| 6,799,865 B2 | 10/2004 | Ellens et al. | |
| 6,809,342 B2 | 10/2004 | Harada | |
| 6,833,565 B2 | 12/2004 | Su et al. | |
| 6,867,542 B1 | 3/2005 | Sun et al. | |
| 6,936,857 B2 | 8/2005 | Doxsee et al. | |
| 6,976,762 B2 | 12/2005 | Chien | |
| 7,002,291 B2 | 2/2006 | Ellens et al. | |
| 7,026,656 B2 | 4/2006 | Lin et al. | |
| 7,040,774 B2 | 5/2006 | Beeson et al. | |
| 7,048,385 B2 | 5/2006 | Beeson et al. | |
| 7,049,740 B2 | 5/2006 | Takekuma | |
| 7,052,152 B2 | 5/2006 | Harbers et al. | |
| 7,192,161 B1 | 3/2007 | Cleaver et al. | |
| 7,350,933 B2 * | 4/2008 | Ng et al. | 362/84 |
| 7,498,734 B2 | 3/2009 | Suehiro et al. | |
| 2002/0003233 A1 | 1/2002 | Mueller-Mach et al. | |
| 2002/0030444 A1 | 3/2002 | Muller-Mach et al. | |
| 2002/0047516 A1 | 4/2002 | Iwasa et al. | |
| 2002/0084745 A1 | 7/2002 | Wang et al. | |
| 2002/0167014 A1 | 11/2002 | Schlereth et al. | |
| 2003/0030060 A1 | 2/2003 | Okazaki | |
| 2003/0067773 A1 | 4/2003 | Marshall et al. | |
| 2003/0174499 A1 | 9/2003 | Bohlander | |
| 2003/0189829 A1 | 10/2003 | Shimizu et al. | |
| 2003/0201451 A1 | 10/2003 | Suehiro et al. | |
| 2003/0218880 A1 | 11/2003 | Brukilacchio | |
| 2003/0230751 A1 | 12/2003 | Harada | |
| 2004/0016938 A1 | 1/2004 | Baretz et al. | |
| 2004/0056260 A1 | 3/2004 | Slater, Jr. et al. | |
| 2004/0116033 A1 | 6/2004 | Ouderkirk et al. | |
| 2004/0124758 A1 | 7/2004 | Danielson et al. | |
| 2004/0129945 A1 | 7/2004 | Uemura | |
| 2004/0203312 A1 | 10/2004 | Bortscheller et al. | |
| 2004/0208210 A1 | 10/2004 | Inoguchi | |
| 2004/0217364 A1 | 11/2004 | Tarsa | |
| 2004/0233664 A1 | 11/2004 | Beeson et al. | |
| 2004/0263073 A1 | 12/2004 | Baroky et al. | |
| 2004/0263074 A1 | 12/2004 | Baroky et al. | |
| 2005/0041424 A1 | 2/2005 | Ducharme | |
| 2005/0073495 A1 | 4/2005 | Harbers et al. | |
| 2005/0093430 A1 | 5/2005 | Ibbetson et al. | |
| 2005/0116635 A1 | 6/2005 | Walson et al. | |
| 2005/0117125 A1 | 6/2005 | Minano et al. | |
| 2005/0117366 A1 | 6/2005 | Simbal | |
| 2005/0135117 A1 | 6/2005 | Lamb et al. | |
| 2005/0162849 A1 | 7/2005 | Keuper | |
| 2005/0174775 A1 | 8/2005 | Conner | |
| 2005/0185419 A1 | 8/2005 | Holman et al. | |
| 2005/0211991 A1 | 9/2005 | Mori et al. | |
| 2005/0219476 A1 | 10/2005 | Beeson et al. | |
| 2005/0237488 A1 | 10/2005 | Yamasaki et al. | |
| 2005/0248958 A1 | 11/2005 | Li | |
| 2005/0265029 A1 | 12/2005 | Epstein et al. | |
| 2005/0276553 A1 | 12/2005 | Kazakevich | |
| 2005/0280785 A1 | 12/2005 | Beeson et al. | |
| 2006/0002141 A1 | 1/2006 | Ouderkirk et al. | |
| 2006/0007553 A1 | 1/2006 | Bogner | |
| 2006/0034082 A1 | 2/2006 | Park et al. | |
| 2006/0034084 A1 | 2/2006 | Matsuura et al. | |
| 2006/0044523 A1 | 3/2006 | Teijido et al. | |
| 2006/0044803 A1 | 3/2006 | Edwards | |
| 2006/0049416 A1 | 3/2006 | Baretz et al. | |
| 2006/0066192 A1 | 3/2006 | Beeson et al. | |
| 2006/0067078 A1 | 3/2006 | Beeson et al. | |
| 2006/0071225 A1 | 4/2006 | Beeson et al. | |
| 2006/0072314 A1 | 4/2006 | Rains | |
| 2006/0091788 A1 | 5/2006 | Yan | |
| 2006/0097385 A1 | 5/2006 | Negley | |
| 2006/0104090 A1 | 5/2006 | Lengyel et al. | |
| 2006/0118805 A1 | 6/2006 | Camras et al. | |
| 2006/0170335 A1 | 8/2006 | Cho et al. | |
| 2006/0186429 A1 | 8/2006 | Chew | |
| 2006/0202219 A1 | 9/2006 | Ohashi | |

FOREIGN PATENT DOCUMENTS

| | | |
|---|---|---|
| EP | 1 160 883 A | 12/2001 |
| EP | 1 686 630 A | 8/2006 |
| EP | 1 691 425 A | 8/2006 |

| | | | |
|---|---|---|---|
| EP | 1 696 496 A | | 8/2006 |
| JP | 10003886 A | * | 1/1998 |
| JP | 2001-243807 | | 9/2001 |
| JP | 2001-243821 | | 9/2001 |
| JP | 2002-299694 | | 10/2002 |
| JP | 2004-055160 | | 2/2004 |
| JP | 2004-055229 | | 2/2004 |
| WO | WO 00/24064 A | | 4/2000 |
| WO | WO 01/40702 A1 | | 6/2001 |
| WO | WO 2005/107420 | | 11/2005 |
| WO | WO 2006/087651 | | 8/2006 |

OTHER PUBLICATIONS

D.A. Vanderwater et al., High-Brightness AlGaInP Light Emitting Diodes, Proceedings of the IEE, vol. 85, No. 11, Nov. 1997, pp. 1752-1764.

Kenichi Yamada et al, Optical Simulation of Light Source Devices Composed of Blue LEDs and YAG Phosphor, J. Light & Vis. Env. vol. 27, No. 2, 2003, pp. 70-74.

N. Narendran et al., Solid-state Lighting: failure analysis of white LEDs, Journal of Crystal Growth, 268 (2004) pp. 449-456.

M. Arik et al., Effects of Localized Heat Generations Due to the Color Conversion in Phosphor Particles and Layers of High Brightness Light Emitting Diodes, American Society of Mechanical Engineers (ASME), Proceedings of InterPACK '03, International Electronic Packaging Technical Conference and Exhibition, Maui, Hawaii, Jul. 2003, pp. 1-9, title page, copyright page and abstract page.

International Search Report for PCT International Application No. PCT/US05/15736 mailed Mar. 30, 2006.

European Search Report of Application No. EP 05 76 1021 dated Jun. 18, 2008.

Song Jae Lee, Study of Photon Extraction Efficiency in InGaN Light-Emitting Diodes Depending on Chip Structures and Chip-Mount Schemes, Optical Engineering, Jan. 2006, vol. 45(1), pp. 014601-1-014601-14.

Search Report from International Application Serial No. PCT/US2007/012311 dated Feb. 15, 2008.

International Search Report of PCT International Application No. PCT/US2005/015736 dated Mar. 30, 2006 (3 pages).

Kim J.K. et al: "Strongly Enhanced Phosphor Efficiency in GaInN White Light-Emitting Diodes Using Remote Phosphor configuration and Diffuse Reflector Cup" Japanese Journal of Applied Physics, Part 2 (Letters) Japan Soc. Appl. Phys Japan, vol. 44, No. 21, 2005, pp. L649-L651.

Search Report for International Application Serial No. PCT/US2007/013132 dated Dec. 3, 2007.

Krames M.R. et al.: "High-power III-nitride emitters for solid-state lighting" Phys. Stat. sol. (a) Wiley-VCH Verlag Berlin GmbH, Berlin, vol. 192, No. 2 (2002) pp. 237-245.

Search Report for International Application Serial No. PCT/US2007/013132 dated Jan. 31, 2008.

First Office Action for Chinese Application No. 2005800222839 dated Jul. 8, 2008 (including English translation).

United States Patent and Trademark Office Office Action for U.S. Appl. No. 11/642,089 dated May 28, 2008.

United States Patent and Trademark Office Office Action for U.S. Appl. No. 11/642,154 dated Sep. 25, 2008.

United States Patent and Trademark Office Office Action for U.S. Appl. No. 11/642,089 dated Mar. 10, 2009.

United States Patent and Trademark Office Office Action in U.S. Appl. No. 11/642,154 dated Jun. 2, 2009.

English language translation of the Third Office Action in Chinese Patent Application No. 200580022283.9 mailed on Jan. 22, 2010.

USPTO Office Action in U.S. Appl. No. 11/644,815 dated Sep. 18, 2009.

USPTO Office Action in U.S. Appl. No. 11/644,815 dated Feb. 3, 2009.

USPTO Office Action in U.S. Appl. No. 11/642,089 dated Jul. 23, 2009.

European Office Action in EP Application No. 05 761 021.4 dated Oct. 8, 2009.

U.S. Office Action for U.S. Appl. No. 11/642,089 mailed on Apr. 9, 2010.

* cited by examiner

HIGH EFFICIENCY LIGHT SOURCE USING SOLID-STATE EMITTER AND DOWN-CONVERSION MATERIAL

RELATED APPLICATION

This application is a U.S. National Phase Application of PCT International Application PCT/US2005/015736 filed May 5, 2005 which claims the benefit of priority to U.S. Provisional Application Ser. No. 60/568,373, filed May 5, 2004 and to U.S. Provisional Application No. 60/636,123 filed Dec. 15, 2004, the contents of each being incorporated by reference herein.

STATEMENT REGARDING FEDERALLY SPONSORED RESEARCH

This invention was made with Government support under Grant Number DE-FC26-01NT41203 awarded by the United States Department of Energy. The Government has certain rights in the invention.

BACKGROUND OF THE INVENTION

Solid state light emitting devices, including solid state lamps having light emitting diodes (LEDs) and resonant cavity LEDs (RCLEDs) are extremely useful, because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. Because large scale semiconductor manufacturing techniques may be used, many solid state lamps may be produced at extremely low cost.

In addition to applications such as indicator lights on home and consumer appliances, audio visual equipment, telecommunication devices and automotive instrument markings, LEDs have found considerable application in indoor and outdoor informational displays.

With the development of efficient LEDs that emit blue or ultraviolet (UV) light, it has become feasible to produce LEDs that generate white light through phosphor conversion of a portion of the primary emission of the LED to longer wavelengths. Conversion of primary emissions of the LED to longer wavelengths is commonly referred to as down-conversion of the primary emission. An unconverted portion of the primary emission combines with the light of longer wavelength to produce white light.

Phosphor conversion of a portion of the primary emission of the LED is attained by placing a phosphor layer in an epoxy that is used to fill the reflector cup, which houses the LED within the LED lamp. The phosphor is in the form of a powder that is mixed into the epoxy prior to curing the epoxy. The uncured epoxy slurry containing the phosphor powder is then deposited onto the LED and is subsequently cured.

The phosphor particles within the cured epoxy generally are randomly oriented and interspersed throughout the epoxy. A portion of the primary light emitted by the LED passes through the epoxy without impinging on the phosphor particles, and another portion of the primary light emitted by the LED impinges on the phosphor particles, causing the phosphor particles to emit complimentary light. The combination of the primary blue light and the phosphor-emitted light produces white light.

Current state of the art LED technology is inefficient in the visible spectra. The light output for a single LED is below that of known incandescent lamps, which are approximately 10 percent efficient in the visible spectra. An LED device having a comparable light output power density necessitates a larger LED or a design having multiple LEDs. Moreover, a form of direct energy absorbing cooling must be incorporated to handle the temperature rise in the LED device itself. More particularly, the LED device becomes less efficient when heated to a temperature greater than 100° C., resulting in a declining return in the visible spectra. The intrinsic phosphor conversion efficiency, for some phosphors, drops dramatically as the temperature increases above approximately 90° C. threshold.

U.S. Pat. No. 6,452,217 issued to Wojnarowski et al. is directed to a high power LED lamp or multiple LED lamp design for use in lighting products and a source of heat removal therefrom. It has LED die arranged in a multi-dimensional array. Each LED die has a semiconductor layer and phosphor material for creation of white light. A reflector gathers and focuses the light from each of the die to approximate a high power LED lamp. FIG. 12 of the Patent illustrates a multi-sided array which emits light at angled ray trace paths. FIG. 19 of the Patent illustrates the LED lamp head being angled.

U.S. Pat. No. 6,600,175 issued to Baretz et al. and U.S. Patent Application Publication No. 2004/0016938 filed by Baretz et al. are directed to solid state light emitting devices that produce white light. The '938 patent application publication is a continuation of the '175 patent. The solid state light emitting device generates a shorter wavelength radiation that is transmitted to a luminophoric medium for down conversion to yield white light. In FIGS. 2 and 6 of the Patent, there is a spaced relationship between the LED and the luminophoric medium. In FIG. 6, for example, light is emitted from the solid state device 82 of shorter wavelength radiation, preferably in the wavelength range of blue to ultraviolet. When luminophoric medium 90 is impinged with the shorter wavelength radiation, it is excited to responsively emit radiation having a wavelength in the visible light spectrum in a range of wavelengths to produce light perceived as white.

U.S. Pat. No. 6,630,691 issued to Mueller-Mach et al. is directed to an LED device comprising a phosphor-converting substrate that converts a fraction of the primary light emitted by a light emitting structure of the LED into one or more wavelengths of light that combine with unconverted primary light to produce white light. As shown in FIG. 1 of the Patent, LED 2 is disposed on substrate 10 which is a phosphor. As shown in FIG. 2 of the Patent, reflective electrode 21 is disposed on the surface of the LED. Some primary light emitted by the LED impinges on reflective electrode 21, which reflects the primary light back through the LED and through the substrate. Some of the primary light propagating into the substrate is converted into yellow light and some is not converted. When the two types of light are emitted by the substrate, they combine to produce white light. Utilizing a reflective electrode improves the efficiency of the LED device by ensuring that the amount of primary light entering the substrate is maximized.

U.S. Patent Application Publication No. 2002/0030444 filed by Muller-Mach et al., which issued as U.S. Pat. No. 6,696,703 to Mueller-Mach et al., is directed to a thin film phosphor-converted LED structure. FIG. 2 of the Application shows an LED structure 2 and a phosphor thin film 21 on a surface of LED 2. The LED generates blue light that impinges on phosphor film 21. Some light passes through phosphor 21 and some is absorbed and converted into yellow light which is emitted from phosphor 21. The blue and yellow light combine to form white light. In FIG. 3 of the Application, a reflective pad 25 is on a surface of LED 2. Light from LED 2 is reflected by reflective pad 25 back through LED 2 and into phosphor 21. Light is then combined, as shown in FIG. 2 of the Patent. FIG. 4 of the Patent uses two phosphor films 31, 33 that are separated from LED 2 by substrate 13. Film 31 emits red light. Film 33 emits green light. Blue light emitted by LED 2 passes through films 31, 33, which combines with the red and green light to produce white light. In the embodiment of FIG. 5 of the Application, LED device 50 includes a plurality of phosphor thin films 37 and 38, A dielectric mirror 36 is disposed between thin film 37 and substrate 13. The dielectric mirror 36 is fully transparent to the primary emission of light emitting structure 2, but is highly reflective at the wavelength of the emissions of the phosphor thin films 37 and 38.

U.S. Patent Application Publication No. 2003/0030060 filed by Okazaki is directed to a white semiconductor light-emitting device provided with an ultraviolet light-emitting element and a phosphor. The phosphor layer has a blue light-emitting phosphor and a yellow light-emitting phosphor, mixedly diffused. The light-emitting device 3 is inside reflective case 5. In FIGS. 2, 4, and 8 of the Application, phosphor layer 6 is formed away from light-emitting element 3. In FIG. 2 of the Application shows phosphor layer 6 formed inside sealing member 7, which is formed from a translucent resin. In FIGS. 4 and 8 of the Application, the phosphor layer is formed on the surface of sealing member 7.

U.S. Patent Application Publication No. 2003/0218880, filed by Brukilacchio, is directed to an LED white light optical system. As shown in FIG. 1 of the Application, optical system 100 includes LED optical source 110, optical filter 120, reflector 130, phosphor layer 135, concentrator 140, a first illumination region 150, a second illumination region 170, and thermal dissipater 190. Optical filter 120 includes a reflected CCT range and a transmitted CCT range. Optical energy that is within the reflected CCT range is prohibited from passing through optical filter 120 (e.g., via reflection). Optical energy that enters the optical filter front face 121 from the phosphor layer back face 137 that is in the reflected range of optical filter 120 is reflected back into phosphor layer 135. Optical energy that is in the transmitted CCT range of optical filter 120 transmits through filter 120 and interacts with reflector 130.

The reflector 130 is a reflective optical element positioned to reflect optical energy emitted from the LED optical source back face 112 back into LED optical source 110. The optical energy interacts with the optical material and a portion of the optical energy exits LED front face 111 and interacts with optical filter 120. The optical energy then continues into the phosphor layer, thereby providing a repeating telescoping circular process for the optical energy that emits from the phosphor layer back face 137. This repeating process captures optical energy that otherwise is lost. Concentrator 140 captures optical energy emitting out of the phosphor layer front face 136.

U.S. Patent Application Publication No. 2002/0003233 filed by Mueller-Mach et al., which issued as U.S. Pat. No. 6,501,102 to Mueller-Mach et al., are directed to a LED device that performs phosphor conversion on substantially all of the primary radiation emitted by the light emitting structure of the LED device to produce white light. The LED device includes at least one phosphor-converting element located to receive and absorb substantially all of the primary light emitted by the light-emitting structure. The phosphor-converting element emits secondary light at second and third wavelengths that combine to produce white light. Some embodiments use a reflective electrode on the surface of the light emitting structure and some do not. In embodiments that use a reflective electrode 21 (FIGS. 2, 3, 6, 7 of the Application), a substrate separates the light emitting structure from the phosphor layers. That is, the light emitting structure is on one side of the substrate and a phosphor layer is on the other side of the substrate. In embodiments that do not use a reflective electrode (FIGS. 4, 5 of the Application), a phosphor layer is disposed on a surface of the light emitting structure.

U.S. Pat. No. 6,686,691 issued to Mueller et al. is directed to a tri-color lamp for the production of white light. The lamp employs a blue LED and a mixture of red and green phosphors for the production of white light. As shown in FIG. 3, lamp 20 includes LED 22 which is positioned in reflector cup 28. LED 22 emits light in a pattern indicated by lines 26 and a phosphor mixture 24 is positioned in the pattern. It may be seen that some unabsorbed light emitted by LED 22 reflects from walls of reflector cup 28 back to phosphor mixture 24. Reflector cup 28 may modify light pattern 26, if light is reflected into a space not previously covered by the initial light pattern. The walls of the reflector cup may be parabolic.

U.S. Pat. Nos. 6,252,254 and 6,580,097, both issued to Soules et al., are directed to an LED or laser diode coated with phosphors. The '097 Patent is a division of the '254 Patent. More particularly, the Patents disclose a blue-emitting LED covered with a phosphor-containing covering. The phosphor-containing covering contains green-emitting phosphors and red-emitting phosphors. The green and red phosphors are excitable by the blue-emitting LED.

U.S. Pat. No. 6,513,949 issued to Marshall et al., U.S. Pat. No. 6,692,136 issued to Marshall et al., and U.S. Patent Application Publication No. 2003/0067773 filed by Marshall et al. are directed to an LED/phosphor/LED hybrid lighting system. The '136 Patent is a continuation of the '949 Patent. The '773 Patent Application issued as the '136 Patent. As shown in FIG. 1A, LED 10 includes an LED chip mounted in a reflective metal dish or reflector 12 filled with a transparent epoxy 13. FIG. 1B schematically depicts a typical phosphor-LED 14 which is substantially identical in construction to the LED of FIG. 1A, except that the epoxy 18 filling the reflector 16 contains grains 19 of one or more types of luminescent phosphor materials mixed homogeneously therein. The phosphor grains 19 convert a portion of the light emitted by LED chip 15 to light of a different spectral wavelength. The system permits different lighting system performance parameters to be addressed and optimized as deemed important by varying the color and number of the LEDs and/or the phosphor of the phosphor-LED.

U.S. Pat. No. 6,603,258, issued to Mueller-Mach et al., is directed to a light emitting diode device that produces white light by combining primary bluish-green light with phosphor-converted reddish light. The LED is mounted within a reflector cup that is filled with a phosphor-converting resin. Primary radiation emitted by the LED impinges on the phosphor-converting resin. Part of the primary radiation impinging on the resin is converted into reddish light. An unconverted portion of the primary radiation passes through the resin and combines with the reddish light to produce white light.

U.S. Pat. No. 6,616,862, issued to Srivastava et al., is directed to halophosphate luminescent materials co-activated with europium and manganese ions. FIG. 3 of the Patent discloses an LED mounted in cup 120 having a reflective surface 140 adjacent the LED. The embodiment includes a transparent case 160 in which phosphor particles 200 are dispersed. Alternatively, the phosphor mixed with a binder may be applied as a coating over the LED surface. A portion of blue light emitted by the LED that is not absorbed by the phosphor and the broad-spectrum light emitted by the phosphor are combined to provide a white light source.

U.S. Pat. Nos. 6,069,440, 6,614,179, and 6,608,332, issued to Shimazu et al., are directed to a light emitting device comprising a phosphor which converts the wavelength of light emitted by a light emitting component and emits light. These Patents also disclose a display device using multiple light emitting devices arranged in a matrix. These Patents are related because they flow from the same parent application.

U.S. Pat. No. 6,580,224 issued to Ishii et al. is directed to a backlight for a color liquid crystal display device, a color liquid crystal display device, and an electroluminescent element for a backlight of a color liquid crystal display device.

U.S. Patent Application Publication No. 2002/0167014 filed by Schlereth et al., which issued as U.S. Pat. No. 6,734,467 to Schlereth et al., are directed to an LED white light source having a semiconductor LED based on GaN or InGaN which is at least partly surrounded by an encapsulation made of a transparent material. The transparent material contains a converter substance for at least partial wavelength conversion of the light emitted by the LED. The LED has a plurality of light-emitting zones by which a relatively broadband light emission spectrum is generated energetically above the emission spectrum of the converter substance.

A publication entitled "Optical simulation of light source devices composed of blue LEDs and YAG phosphor" by Yamada K., Y. Imai, and K Ishii, published in Journal of Light and Visual Environment 27(2): 70-74 (2003) discloses using light reflected from a phosphor as an effective way of obtaining high output from light sources composed of LEDs and phosphor.

SUMMARY OF INVENTION

To meet this and other needs, and in view of its purpose, the present invention provides a light emitting apparatus including a source of light for emitting light; a down conversion material for receiving the emitted light and converting the emitted light into transmitted light (or forward transmitted light) and reflected light (or backward transmitted light); and an optic device configured to (a) collect and transfer the emitted light onto the down conversion material and (b) receive the reflected light and transfer the reflected light outside of the optic device.

According to one aspect of the invention, the source of light is a semiconductor light emitting diode, including one of a light emitting diode (LED), a laser diode (LD), or a resonant cavity light emitting diode (RCLED).

According to another aspect of the invention, the down conversion material includes one of phosphor or other material for absorbing light in one spectral region and emitting light in another spectral region.

According to a further aspect of the invention, the optic device includes at least one of a lens or a light guide having a light transmissive property.

According to still another aspect of the invention, the source of light is disposed adjacent a first end of the optic device.

According to yet another aspect of the invention, the down conversion material is disposed adjacent a second end of the optic device, where the second end is opposed to the first end.

According to still a further aspect of the invention, the source of light may include a plurality of semiconductor light emitters.

According to yet a further aspect of the invention, the collecting device may be included for collecting the reflected light which is transferred out of the optic device. The collecting device may be a reflector.

Another exemplary embodiment of the invention includes another light emitting apparatus having a cylindrical optic including a light transmissive material; a light radiation source disposed within the cylindrical optic; and a down conversion material, disposed at a middle section of and within the cylindrical optic, for at least one of transmitting or reflecting light transmitted by the light radiation source.

According to one aspect of the invention, the light radiation source is a semiconductor light emitter, including one of a light emitting diode (LED), a laser diode (LD), or a resonant cavity light emitting diode (RCLED).

According to another aspect of the invention, the light radiation source is disposed adjacent one lateral end of the cylindrical optic.

According to a still another aspect of the invention, the light radiation source may include first and second radiation sources, spaced from each other and both may be disposed adjacent one lateral end of the cylindrical optic.

According to yet another aspect of the invention, the down conversion material includes one of phosphor or other material for absorbing light in one spectral region and emitting light in another spectral region.

According to a further aspect of the invention, the down conversion material is disposed substantially parallel to a longitudinal axis of the cylindrical optic.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

The inventors have discovered that the performance of phosphor converted LEDs is negatively affected when placing the down-conversion phosphor close to the LED die. Poor performance is mainly due to the fact that the phosphor medium surrounding the die behaves like an isotropic emitter, and some portion of the light that reflects back towards the die circulates between the phosphor layer, the die, and the reflector cup. As a result, the light coupled back into the device increases the junction temperature, thus reducing system efficacy and increasing the yellowing of the encapsulant. All of these factors reduce the light output over time.

Figure 1:
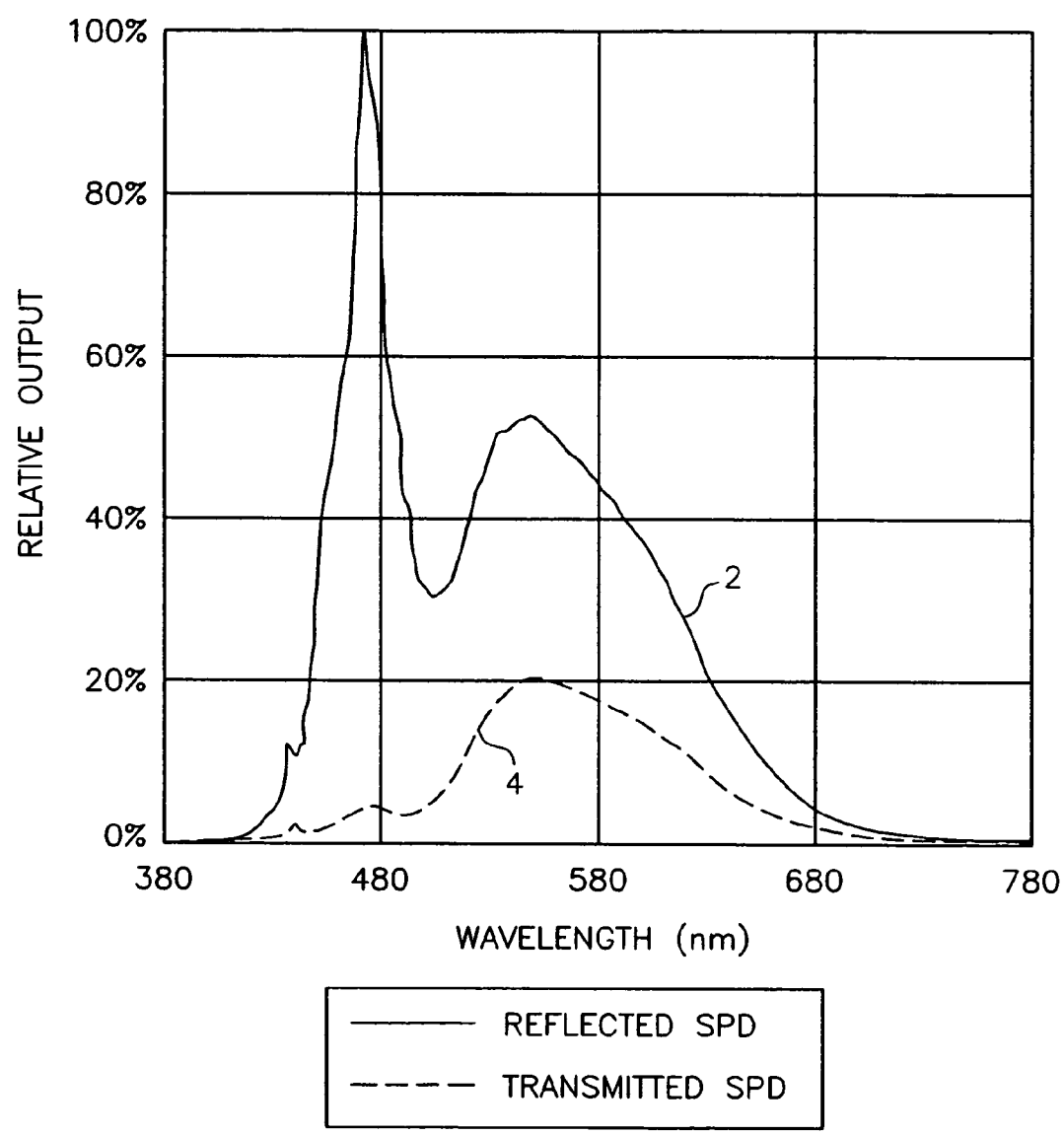
FIG. 1 is a graph of relative output versus wavelength showing reflected and transmitted spectral distribution of light for one type of phosphor (YAG:Ce)

The literature shows that 60 percent of the light impinging on the phosphor layer is reflected back, contributing to the described effects (Yamada, et al., 2003). Lab measurements of eight YAG:Ce phosphor plates proved that nearly 60% of the radiant energy is reflected back in the direction of the blue LED source. The absolute magnitude of the radiant energy reflected depends, among other factors, on the density of the phosphor coating. FIG. 1 shows the measured reflected spectral power distribution 2 of a blue LED with a YAG:Ce phosphor plate. FIG. 1 also shows the measured transmitted spectral power distribution 4 of the same arrangement. As shown, most of the light is reflected back and not transmitted forwardly.

It will be appreciated that the terms "transmitted and reflected light" is used throughout this application. However, more precisely the terms are "forward transmitted and backward transmitted light". As the phosphor particles absorb the short wavelength light and emit the down converted light, the emitted light goes in all directions (Lambertian emitter), and therefore, a portion of the light goes up and another portion of the light comes down. The light that goes up (or outward) is the transmitted portion of the light and the light that comes down towards the LED die is the reflected portion.

Such effects are expected to be of a higher magnitude in RCLEDs, because their light output is much more collimated. Consequently, the packaging attempts to capture both the transmitted and reflected components to improve system efficiency. Additionally, the inventors have created packaging that allows the phosphor layer to be moved away from the die, preventing light feedback into the LED and RCLED. As a result, the life of the LED and RCLED is improved. At the same time, light from the RCLED impinges on the phosphor layer uniformly to obtain a uniform white light source. In addition, the packaging increases the efficiency of the device by allowing more of the light reflected off the phosphor layer to exit the device.

Figure 2:
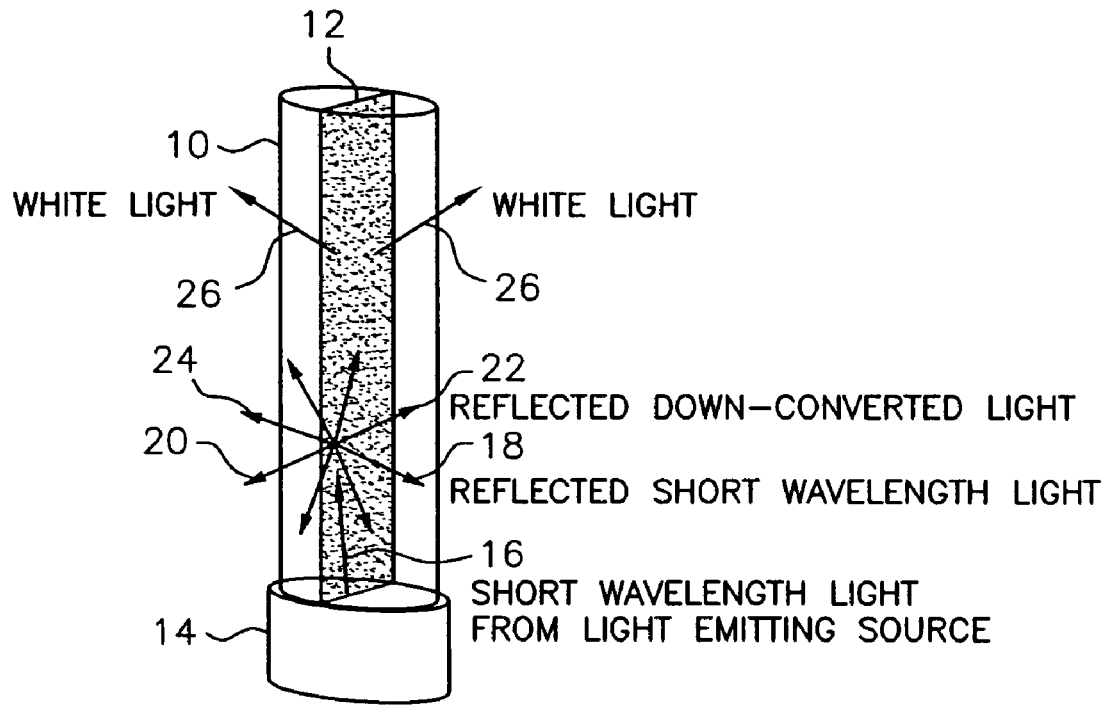
FIG. 2 is a high efficiency light source that uses solid state emitter(s) and down conversion material, in accordance with an exemplary embodiment of the present invention.

FIG. 2 illustrates a first exemplary embodiment of the invention having a distributing optic, light transmissive, enclosure optic 10, which has a cylindrical geometry. As shown, enclosure optic 10 includes phosphor layer 12 embedded in the middle section of the distributing optic. This configuration effectively splits the distributing optic into substantially two equal pieces, or portions. That is, the phosphor layer may be a strip that is substantially parallel to a longitudinal axis of cylindrical optic 10.

In one exemplary embodiment, phosphor layer 12 may be a YAG:Ce phosphor layer. In an alternative exemplary embodiment, the phosphor layer may comprise other phosphors, quantum dots, quantum dot crystals, quantum dot nano crystals or other down conversion material. It will be understood that other embodiments of the present invention may include a phosphor layer that is similar to phosphor layer 12. Unlike the embedded phosphor layer, shown in FIG. 2, however, other embodiments may have a phosphor layer that is not embedded. Moreover, the phosphor layer need not be of uniform thickness, rather it may be of different thicknesses or different phosphor mixes to create a more uniform color output.

One or more LEDs or RCLEDs may be placed inside the cylindrical optic at a bottom portion, designated as 14. In an alternative embodiment, one or more LEDs/RCLEDs may be placed at a location other than at the bottom portion of the cylindrical optic.

Short wavelength light 16 is emitted from the LEDs/RCLEDs. Short wavelength light is in the range of 250 nm to 500 nm. Because phosphor layer 12 is substantially in the middle of the cylindrical optic, short-wavelength light from the LEDs/RCLEDs causes short-wavelength light to impinge from either side of the cylindrical optic onto the phosphor layer 12. The impingement of short-wavelength light onto the phosphor layer produces light with four components: short-wavelength light 18, reflected from the phosphor layer; short-wavelength light 20, transmitted through the phosphor layer; down-converted light 22, reflected from the phosphor layer; and down-converted light 24, transmitted through the phosphor layer. These four components, which are produced on both sides of the phosphor layer, combine and produce white light 26. Since this process takes place from both sides of the phosphor layer, the total light extraction is increased.

The light (short-wavelength and down-converted light), that otherwise would be reflected back into the cylindrical optic (if the phosphor layer was not embedded in the cylindrical optic, or die), is advantageously transmitted to the exterior or outside of the cylindrical optic, through the light transmissive properties of the cylindrical optic.

As an example, a high-flux blue (470 nm) illuminator LED (Shark series) emitter by Opto Technology may be used. The density of phosphor layer 12 may be in the range of 4-8 mg/cm$^2$ (other densities are also contemplated), the length of cylindrical optic 10 may be in the range of 2 to 4 inches, and the diameter of the cylindrical optic may be about 0.5 inches. As another example, a different package efficiency and uniformity may be achieved by changing the phosphor-layer density, and the length and diameter of the cylindrical optic. Better efficiency and uniformity of light along the circumference of the cylindrical optic may be achieved when the cylindrical optic is 2.25 inches long.

The embodiment shown in FIG. 2 may be formed from half-round acrylic rod segments that are cut from a fully-round acrylic rod and polished. Phosphor may be mixed with optically clear epoxy and then Spread uniformly on the flat surface of each rod segment. The rod segments may then be attached together and put into an oven to cure the epoxy.

The overall emission loss for a 2.25 inch optical element (cylindrical optic) was found to be approximately 16%. The losses included: 6% light reflected back to the LED, 7% Fresnel loss, and 3% irrecoverable loss due to mounting hardware.

Approximately half of the losses may be attributed to the Fresnel loss, which occurs at the boundaries between media having different refractive indices. Fresnel losses may be reduced by using a coupling mechanism between the LEDs/RCLEDs and the cylindrical optic. In addition, losses may be recovered by using an anti-reflective coating on the LEDs/RCLEDs to prevent light from reflecting back to the LEDs/RCLEDs.

Figure 3:
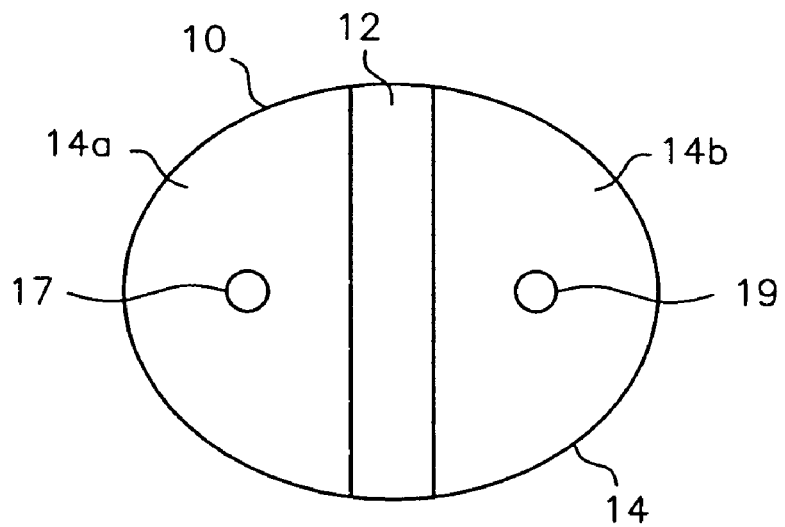
FIG. 3 is a cross-sectional view of a bottom portion of the high efficiency light source shown in FIG. 2.

FIG. 3 is a cross-sectional view of the cylindrical optic, at the bottom portion, designated as 14. As shown, cylindrical optic 10 includes two half-round acrylic rod segments 14a and 14b. Phosphor layer 12 is sandwiched between acrylic rod segment 14a and acrylic rod segment 14b. Each acrylic rod segment includes light emitting sources 17 and 19. Light emitting sources 17 and 19 may each be a semiconductor light emitting diode, such as a light emitting diode (LED), a laser diode (LD), or a resonant cavity LED (RCLED). It will be understood that more than two light emitting sources may be included in bottom portion 14. As such, there may be an array of multiple light emitters disposed within acrylic rod segment 14a and another array of multiple light emitters disposed within acrylic rod segment 14b. These arrays may be arranged symmetrically with respect to each other, in a manner that is similar to light sources 17 and 19, which are shown disposed symmetrically about phosphor layer 12 of FIG. 3.

Figure 4:
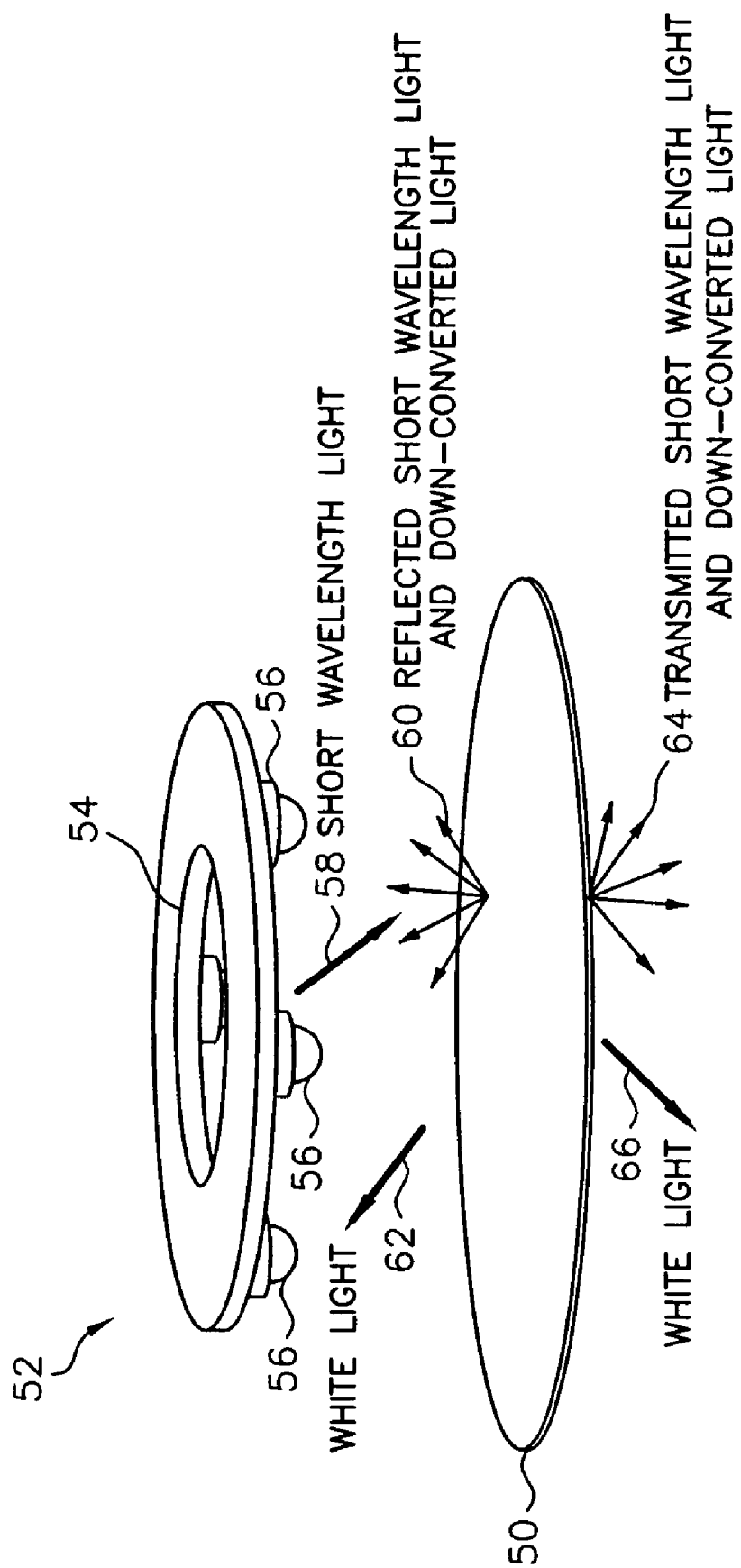
FIG. 4 illustrates another high efficiency light source that uses multiple solid state emitters and down conversion material, in accordance with another exemplary embodiment of the present invention.

FIG. 4 illustrates another exemplary embodiment of the invention. This embodiment may be used in interior spaces where general ambient lighting is required. As shown, the device includes phosphor plate 50 (for example YAG:Ce or other phosphors, as enumerated previously). The device also includes multiple semiconductor light emitting diodes 56 forming an array, such as LED/RCLED array 52. The array 52 is mounted on substrate 54 that may be of aluminum material. In an exemplary embodiment, substrate 54 may be circular. In the exemplary configuration illustrated in FIG. 4, the LEDs/RCLEDs are arranged in a spaced relation to each other and placed around the circular substrate.

The array of light emitting diodes are placed on the substrate so that the light emitting surfaces of the diodes face toward phosphor layer plate 50. In this manner, diodes 56 emit short wavelength light toward phosphor layer plate 50.

As the short wavelength light impinges on the phosphor layer plate, four components of light results: short wavelength light and down-converted light 60 and transmitted short wavelength light and transmitted down converted light 64. The short wavelength light and down converted light 60 is reflected, as shown, within the device to produce white light 62. The transmitted short wavelength light and down-converted light 64 is transmitted outside of the device to produce white light 66.

Figure 5A:
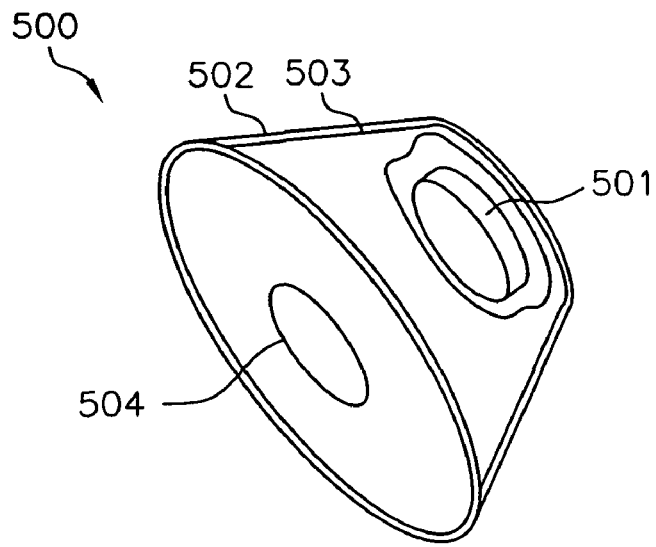
FIG. 5A is yet another embodiment of a high efficiency light source that uses solid state emitter(s) and down conversion material, in accordance with another exemplary embodiment of the present invention.
Figure 5B:
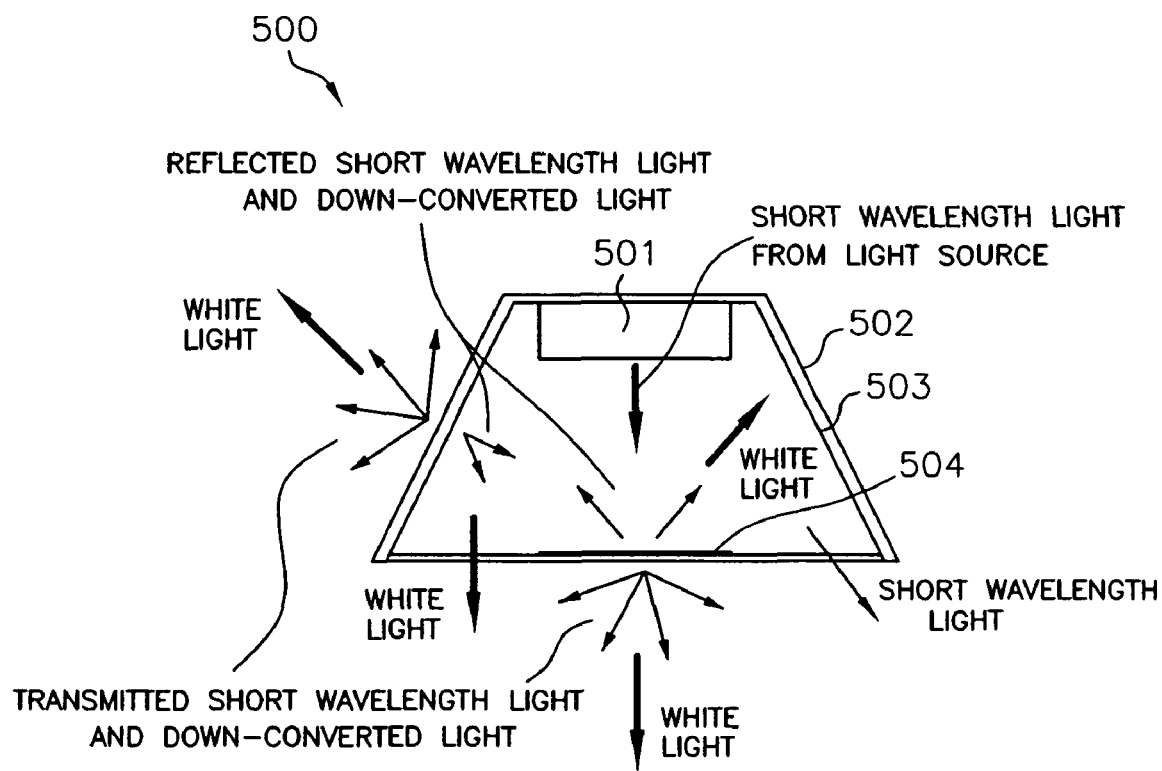
FIG. 5B is a cross-sectional view of the high efficiency light source shown in FIG. 5A.

FIGS. 5A and 5B illustrate another exemplary embodiment of the invention. As shown, device 500 includes cup 502, and one or more light emitters 501 disposed within cup 502 at a base of cup 502. Also included are phosphor layers 503 and 504. Phosphor layer 504 is disposed at the opposite end from the base of light emitter 501 and at a substantial center from the walls of cup 502. Phosphor layer 503 is deposited on the inside of the walls of cup 502. The embodiment shown in FIGS. 5A and 5B may be used in interior spaces where general ambient lighting is required.

The device 500 includes cup 502 which may be a transparent cup having one LED/RCLED or multiple LEDs/RCLEDs arranged in an array. The cup includes one phosphor layer 503 bonded to the inside transparent wall of cup 502. The other phosphor layer may be bonded only at the center area of the cup. Accordingly, most of the reflected short wavelength light and down-converted light may exit directly from the transparent portion of the front surface. Narrow beams of emitted light from the LED/RCLED are preferred in this embodiment to minimize short wavelength light from the LED/RCLED directly exiting the transparent portion of the front surface without impinging on the phosphor layer. The cup may be made of glass or acrylic.

The inside portion of cup 502 may be filled with glass or acrylic material, thereby sandwiching phosphor layer 503 between cup 502 and the inside portion contained within cup 502. Phosphor layer 504 may also be bonded onto the exterior surface of the glass or acrylic material. In an alternate embodiment, phosphor layer 504 may be placed within the glass or acrylic material, in a manner similar to that described for the phosphor layer sandwiched between two half-round acrylic rods, shown in FIGS. 2 and 3.

Figure 6:
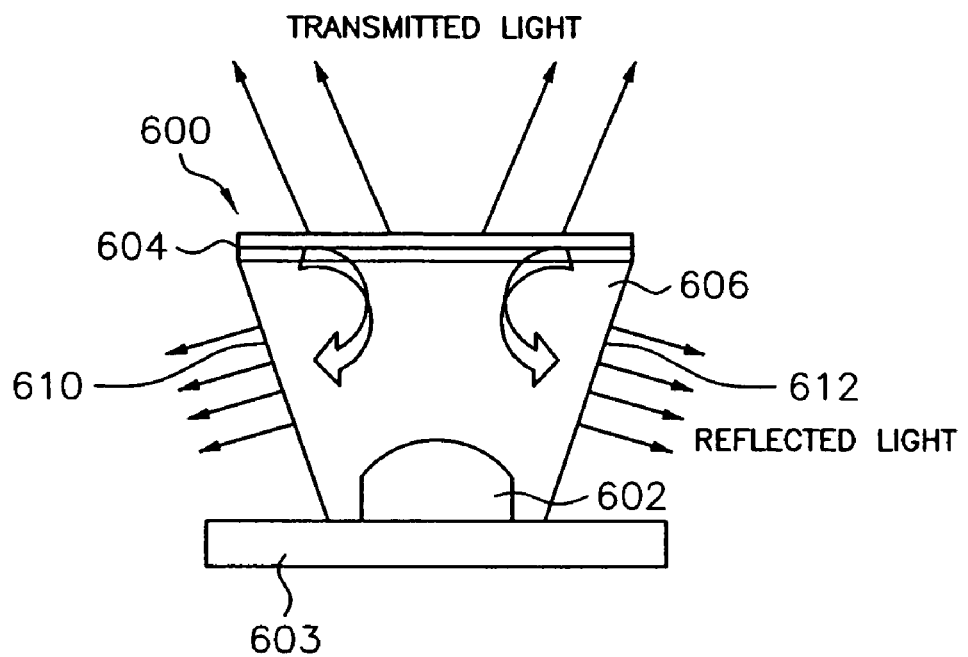
FIG. 6 is an illustration of still another high efficiency light source that uses solid state emitter(s) and down conversion material, in accordance with an exemplary embodiment of the present invention.

FIG. 6 illustrates yet another exemplary embodiment of the invention. As shown, device 600 includes light emitter 602 separated from phosphor layer 604 by optics 606 which may be made of a transparent medium. In an exemplary embodiment, the transparent medium may be air. In an alternative embodiment, the transparent medium may be glass or acrylic. Phosphor layer 604 may be mounted or deposited on optics 606 having transparent walls 610 and 612. (Walls 610 and 612 may be a continuous wall, if optics 606 has a circular cross-section.)

Figure 7:
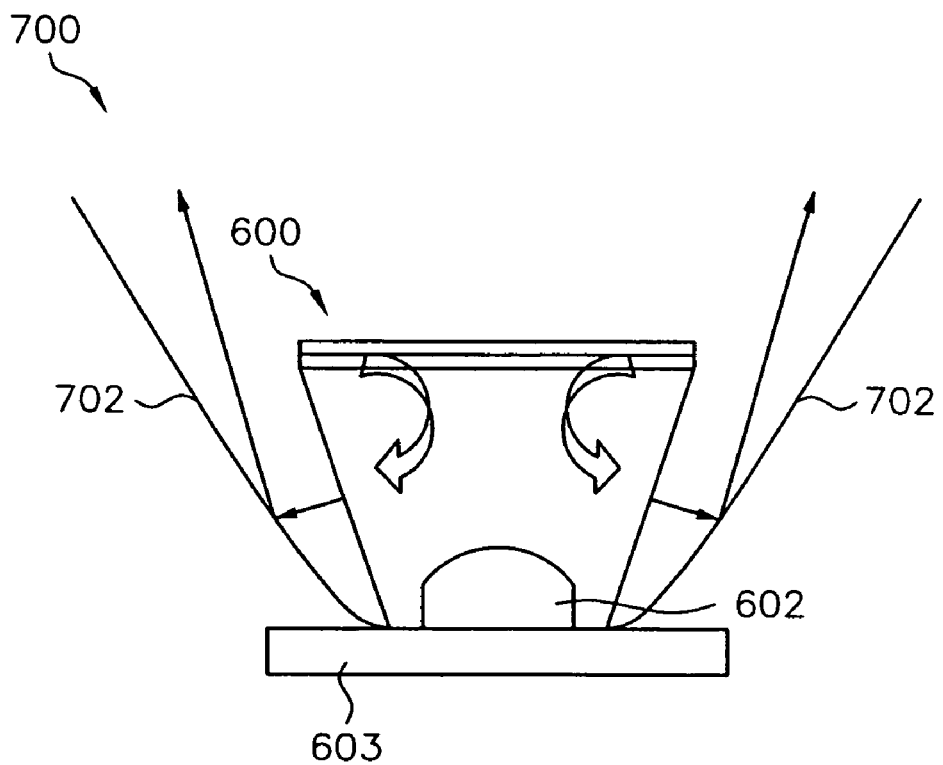
FIG. 7 depicts a reflector surrounding the high efficiency light source shown in FIG. 6, for redirecting the rays emitted from the light source(s)
Figure 8A:
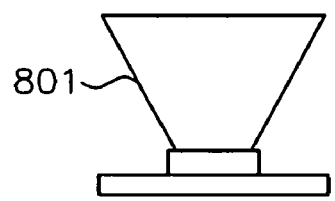
FIGS. 8A through 8E illustrate various geometric shapes for the optical element, or optical lens, disposed immediately above an exemplary light emitting source, in accordance with different exemplary embodiments of the present invention.
Figure 8B:
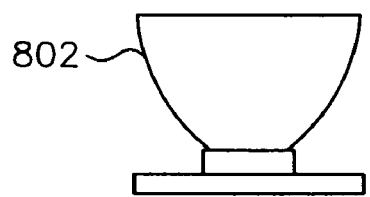
Figure 8C:
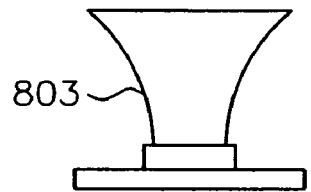
Figure 8D:
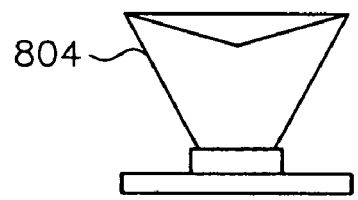
Figure 8E:
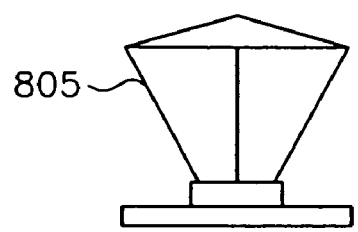

FIG. 7 illustrates yet another exemplary embodiment of the invention. As shown, device 700 includes device 600 disposed within reflector 702. Reflector 702 has a geometric shape of a parabola. The invention is not so limited in that reflector 702 may have other geometrical shapes, such as a cone, a sphere, a hyperbola, an ellipse, a pyramid, or may be box-shaped, for example. The advantages of device 700 include better control of the beam output distribution and better uniform output of the color.

Substrate 603 may be used for mounting the light emitting source (602), one end of optics 606, and one end of reflector 702, as shown in FIGS. 6 and 7.

Similar to the other embodiments of the invention, light emitting source 602 may be one or multiple semiconductor light emitting diodes, such as an LED, LD or RCLED. The light emitting diodes may be mounted in an array of diodes, similar to the array of light sources depicted as array 52 in FIG. 4. In addition, phosphor layer 604 may be similar to phosphor layer 50 depicted in FIG. 4.

FIGS. 8A through 8E depict different geometric shapes of an optic element. Optic element 801 is of a conical geometry. Optic element 802 is of a spherical geometry. Optic element 803 is of a hyperbolic geometry. Optic element 804 is of a pyramidal geometry. Optic element 805 is of a box-shaped geometry. Other geometrical shapes may include a parabolic or elliptical shape. In addition, the top of the wider surface of each optical element may be flat, or may have another geometrical shape.

Similar to the other embodiments, optic elements 801 through 805 may be made of a transparent material, thereby functioning like an optical lens (similar to optics 606 of FIG. 6), or may be a hollow cavity formed by walls made from transparent material (similar to walls 610 and 612 of FIG. 6).

Although not shown, a reflector (similar to reflector 702, shown in FIG. 7) may be positioned to surround each optical element 801 through 805. Furthermore, each optical element 801 through 805 may include a phosphor layer (similar to phosphor layer 604, shown in FIG. 6). This phosphor layer (not shown) may be deposited on top of the wider flat surface of each optical element, opposite to its respective light emitting source. Alternatively, this phosphor layer (not shown) may be sandwiched within each optical element, near the wider flat surface of the respective optical element and opposite to its respective light emitting source.

Figure 9A:
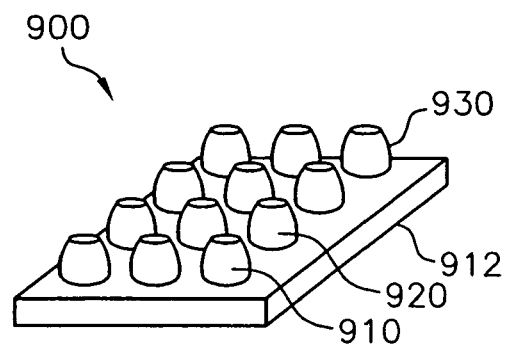
FIG. 9A shows a device having multiple high-efficiency light sources that use solid state emitter(s) and down conversion material placed on a lightpipe for redirecting the light rays from the light sources, in accordance with an exemplary embodiment of the present invention.
Figure 9B:
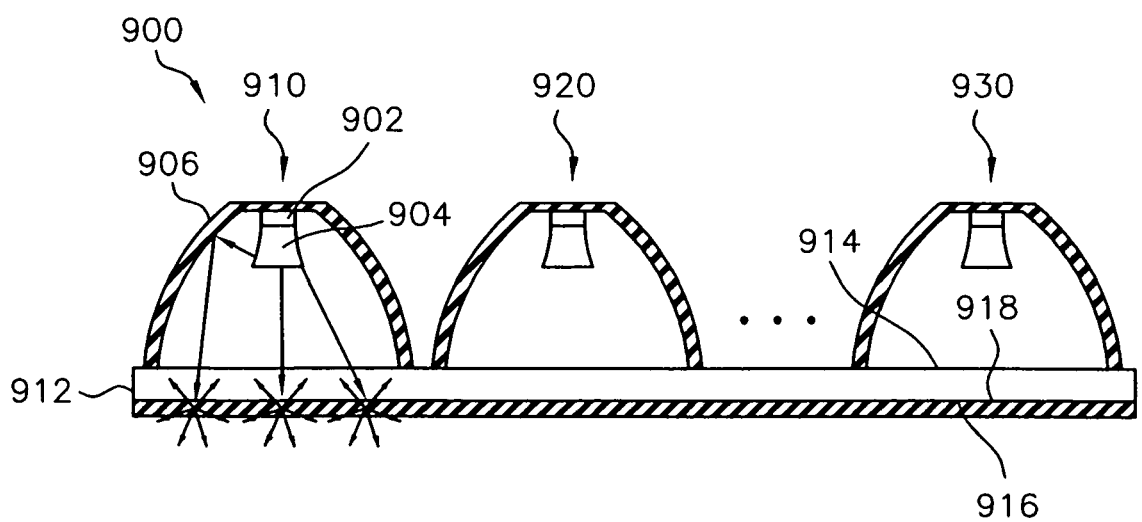
FIG. 9B is a cross-sectional view of the device shown in FIG. 9A.

Referring next to FIGS. 9A and 9B, there is shown a two dimensional array of lenses, generally designated as 900. As shown in FIG. 9A, an array of N×M high efficiency light source devices are arranged on top of lightpipe 912. Three of the light source devices are designated as 910, 920 and 930. The remaining light source devices in the N×M array are identical to any one of light source device 910, 920, or 930. In turn, any one of these light source devices may be similar to device 700 of FIG. 7.

As best shown in FIG. 9B, each of light source devices 910, 920 and 930 includes light emitter 902, lens 904 and a phosphor layer (not shown), which may be similar to phosphor layer 604 of FIG. 6. Also included is reflector 906, which redirects the transmitted and reflected light from light emitter 902 towards rectangular lightpipe 912.

Lightpipe 912, as shown, includes side 914 abutting light source devices 910, 920 and 930, and another opposing side 916 further away from the light source devices. On top of opposing side 916, there is microlens layer 918. The microlens 918 layer may be bonded to the deposited phosphor layer.

Figure 10A:
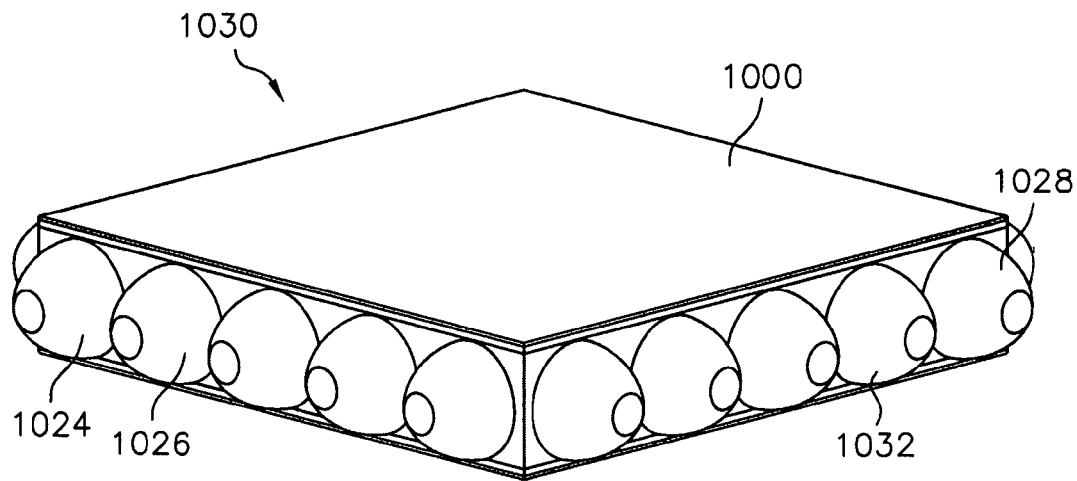
FIG. 10A is an illustration of another device having multiple high efficiency light sources that use solid state emitter(s) and down conversion material disposed around edges of a lightpipe for redirecting the light rays from the light sources, in accordance with an exemplary embodiment of the present invention.
Figure 10B:
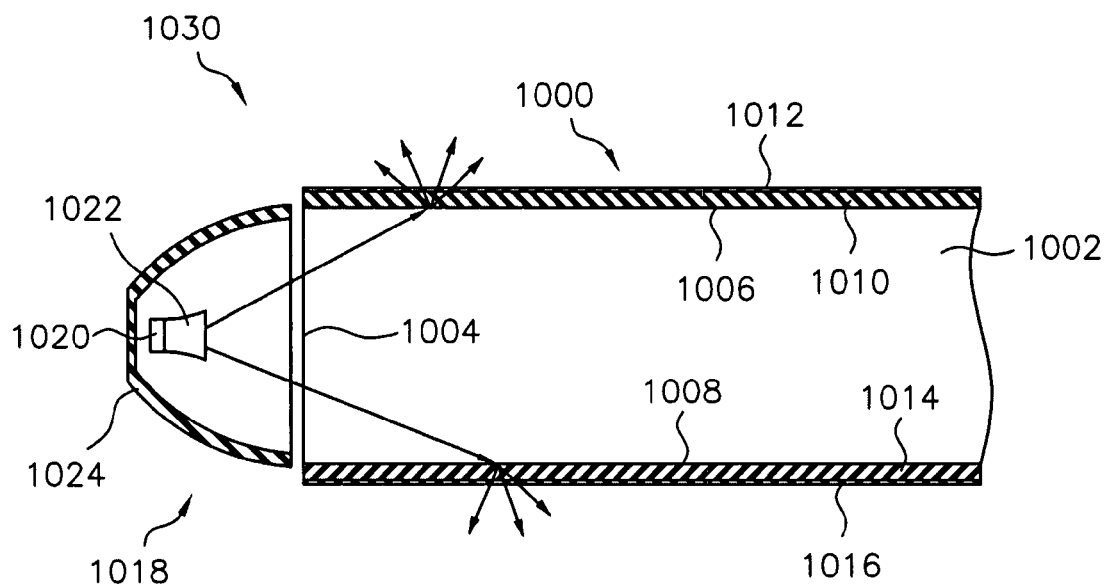
FIG. 10B is a cross-sectional view of the device shown in FIG. 10A.

FIGS. 10A and 10B illustrate another exemplary embodiment of a high efficiency light source, generally designated as 1030, in which the light source devices (similar to light source device 700 of FIG. 7) are spaced around the edges of a lightpipe. As shown in FIG. 10A, several light source devices, such as light source devices 1024, 1026, 1028, 1032 etc., are placed around the edges of lightpipe 1000.

A cross-section of high efficiency light source 1030 is shown in FIG. 10B. As shown, light source device 1018 is configured to direct light into lightpipe 1000. Light source device 1018 includes light emitter 1020, optical lens 1022 and a phosphor layer (not shown) in opposing relationship to light emitter 1020. Also included is reflector 1024 for re-directing the transmitted and reflected light from light emitter 1020 toward the edge of and into lightpipe 1000.

Lightpipe 1000 includes edge 1004, top side 1006 and bottom side 1008. In top side 1006, there is a deposit of phosphor layer 1010 and a layer of microlens diffuser 1012. Similarly, in bottom side 1008, there is a deposit of phosphor layer 1014 and a layer of microlens diffuser 1016. The microlens layers may each be bonded to its respective phosphor layers.

Figure 11:
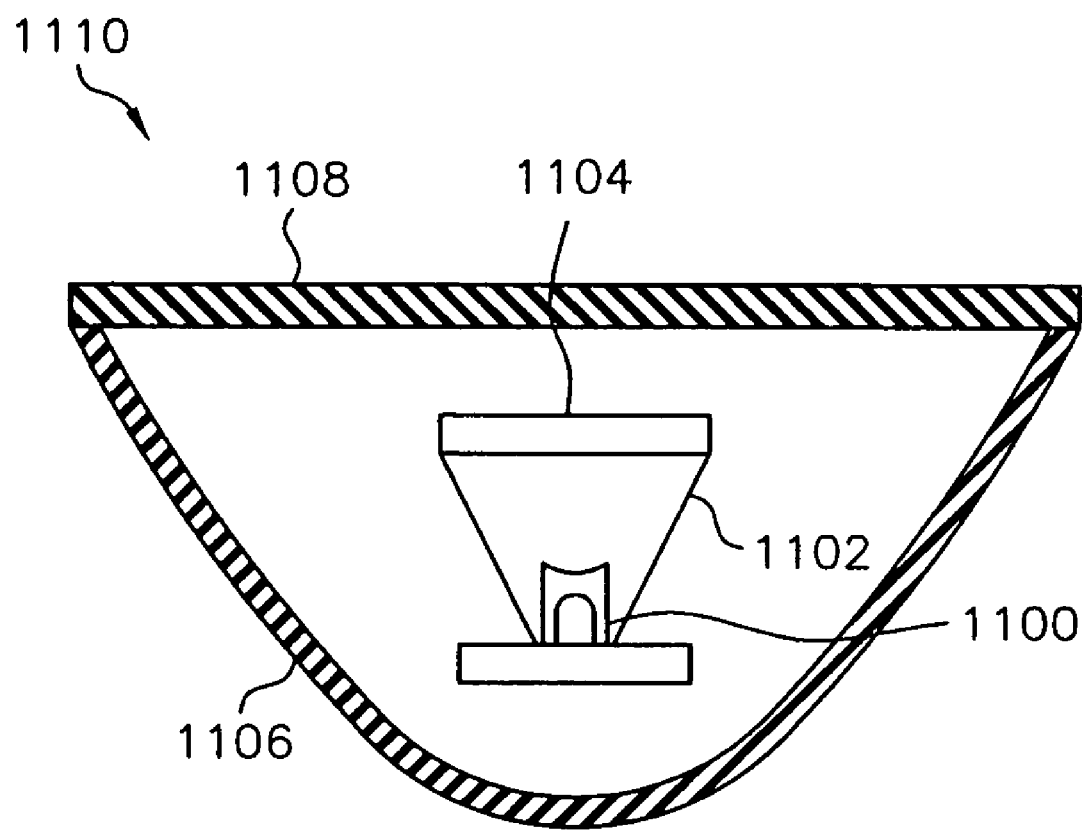
FIG. 11 is an illustration of yet another high efficiency light source arranged so that it is surrounded by a reflector and a high efficiency microlens diffuser, in accordance with an exemplary embodiment of the present invention.

FIG. 11 illustrates still another exemplary embodiment of the invention. As shown, device 1110 includes light source 1100, lens 1102 and phosphor layer 1104. The phosphor layer is deposited on top of lens 1102, so that the phosphor layer is away from the LED, in a manner that is similar to that shown in FIG. 6. The light source/lens/phosphor configuration is surrounded by reflector 1106 having a high-reflectance. In an exemplary embodiment the measured reflectance may be in the range of 90% to 97%. In addition, a high efficiency microlens diffuser 1108 is placed across the top of reflector 1106. In an exemplary embodiment, the microlens diffuser may exhibit greater than 95% efficiency.

Figure 12:
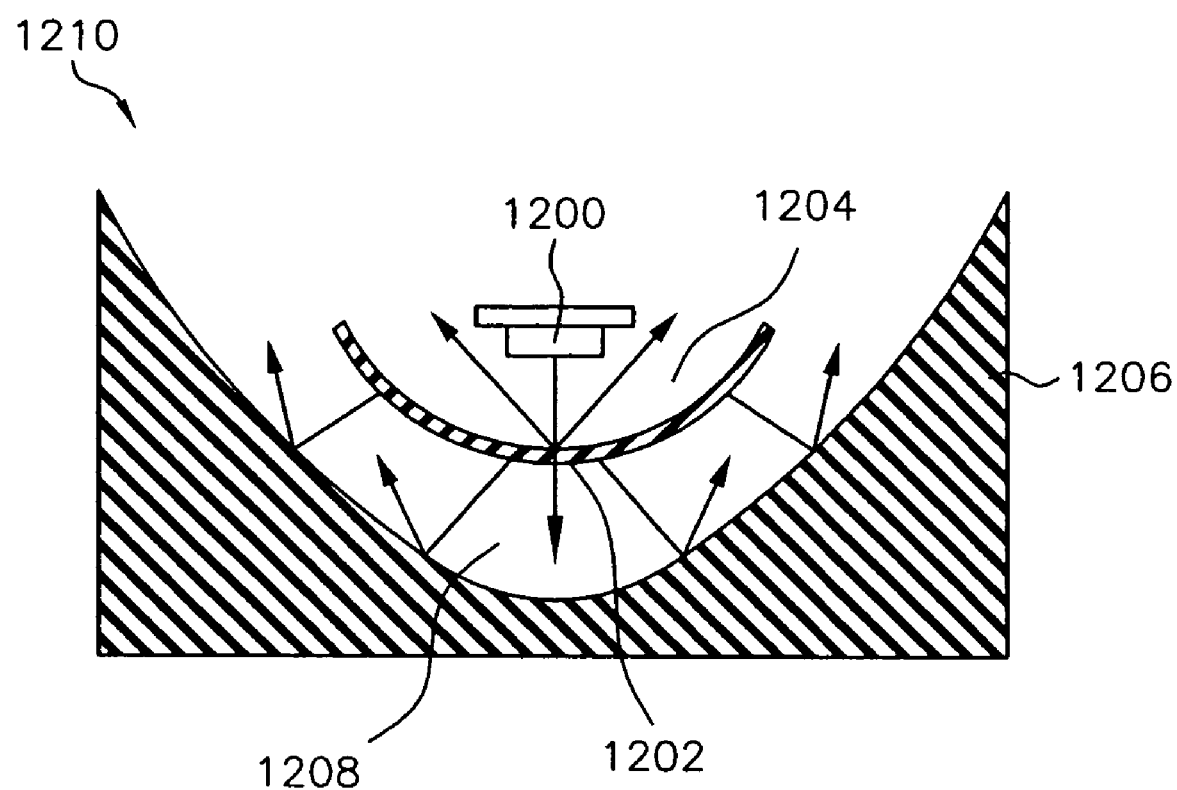
FIG. 12 is an illustration of still another high efficiency light source directing light towards a light conversion material and a reflector, where the light conversion material is disposed between the high efficiency light source and the reflector, in accordance with an exemplary embodiment of the present invention.

FIG. 12 illustrates yet another exemplary embodiment of the invention. As shown, device 1210 includes light source 1200 facing phosphor layer 1202 and reflector 1206. A transparent medium 1204 may fill the space between light source 1200 and phosphor layer 1202. In an exemplary embodiment, phosphor layer 1202 may be in the shape of a parabola, or other curved shape, similar to one of the geometric shapes previously enumerated. Reflector 1206 may be spaced away from the phosphor layer and the light source. A transparent medium 1208 may be used to fill the space between the phosphor layer and the reflector. As shown, phosphor layer 1202 is disposed between the light source 1200 and reflector 1206.

While it is well known that the phosphor used in white light-emitting diodes (LEDs) backscatters more than half the light emitted, no one to date has shown that this light may be recovered as photons to increase the overall efficacy of a white light source. The inventors have experimentally verified a scattered photon extraction (SPE) method provided by the various embodiments of the invention, that significantly increases the overall efficacy of a white light source. At low currents, the SPE package showed over 80 lm/W white light with chromaticity values very close to the blackbody locus.

Of the different methods available for creating white light, the phosphor-converted emission method is the most common. A first phosphor-converted white LED uses cerium doped yttrium aluminum garnet (YAG:Ce) phosphor in combination with a gallium nitride (GaN) based blue LED. In a typical white LED package, the phosphor is embedded inside an epoxy resin that surrounds the LED die. Some portion of the short-wavelength radiation emitted by the GaN LED is down-converted by the phosphor, and the combined light is perceived as white by the human eye. Although these products proved the white LED concept and have been used in certain niche illumination applications, they are not suited for general lighting applications because of their low overall light output and low efficacy.

To achieve higher luminous efficacy with white LEDs, improvements are needed at several stages: internal quantum efficiency, extraction efficiency, and phosphor-conversion efficiency. Some researchers have taken on the challenge of researching the materials and growth aspects of the semiconductor to improve internal quantum efficiency. Others are exploring shaped chips, photonic crystals, micron-scale LEDs, and other novel methods to improve light extraction efficiency. Still others are investigating new phosphors that have greater down-conversion efficiencies and better optical properties.

Although past literature acknowledges that a significant portion of the light is backscattered by the phosphor and lost within the LED due to absorption, to the best of the inventors' knowledge no one to date has attempted to improve performance by extracting these backscattered photons, by way of the scattered photon extraction (SPE) method, provided by the embodiments of the present invention, which significantly increases the overall light output and luminous efficacy of a phosphor-converted white LED by recovering the scattered photons.

To better understand the interaction between primary short-wavelength light and phosphor and to quantify the amount of forward and backward scattered light, several circular glass plates, 5 cm in diameter, were coated by the inventors with different densities of YAG:Ce phosphor ranging from 2 mg/cm$^2$ to 8 mg/cm$^2$. These phosphor plates were placed between two side-by-side integrating spheres with the phosphor coating facing the right sphere. The phosphor material was excited by radiation from a 5 mm blue LED placed inside the right sphere 2.5 cm away from the glass plate. A spectrometer measured the light output from each sphere through the measurement ports. Light output measured from the left and right spheres indicated the amount of light transmitted through and reflected off the phosphor layer, respectively. The spectrometer data was analyzed to determine the amount of flux in the blue and yellow regions, corresponding to the radiant energy emitted by the LED and the converted energy from the YAG:Ce phosphor. Experimental results showed that the spectral power distributions for the transmitted and reflected radiations are different, especially the amount of blue-to-yellow ratio. The amount of transmitted and reflected radiations depends on the phosphor density, with lower densities resulting in higher percentages of transmitted radiation. Typically, the phosphor density may be controlled such that the transmitted blue and yellow light are in the correct proportion to produce white light of a suitable chromaticity, which typically places it on or close to the blackbody locus. From the gathered data, it was estimated that about 40% of the light is transmitted when creating a balanced white light, and the remaining 60% is reflected. Yamada et al. found similar results, as reported in K. Yamada, Y. Imai, K. Ishii, J. Light & Vis. Env. 27(2), 70 (2003). In a conventional white LED, a significant portion of this reflected light is absorbed by the components surrounding the die, one of the reasons for its low luminous efficacy.

Figure 13:
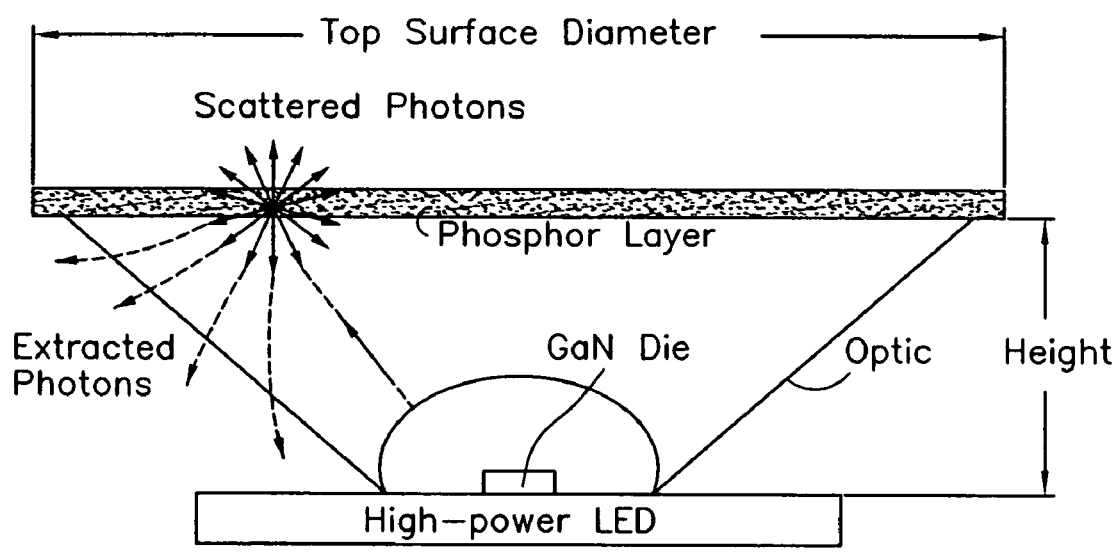
FIG. 13 is a schematic diagram depicting a high powered light emitter radiating light towards a light conversion material by way of an optical element, in accordance with an exemplary embodiment of the present invention.

A method by which most of the reflected light may be recovered is illustrated in FIG. 13, which shows schematically an LED package with scattered photon extraction (SPE) implemented. Unlike a typical conventional white LED package, where the phosphor is spread around the die, in the SPE package of the invention the phosphor layer is moved away from the die, leaving a transparent medium between the die and the phosphor. An efficient geometrical shape for the package may be determined via ray tracing analysis. The geometry of the package plays an important role, and the geometry shown in FIG. 13 efficiently transfers the light exiting the GaN die to the phosphor layer and allows most of the backscattered light from the phosphor layer to escape the optic. Compared with the typical conventional package, more photons are recovered with this SPE package. Here again the phosphor density determines the chromaticity of the final white light.

It is worth noting that the SPE package requires a different phosphor density to create white light with chromaticity coordinates similar to the conventional white LED package. This difference is a result of the SPE package mixing transmitted and back-reflected light with dissimilar spectra, whereas the conventional package uses predominantly the transmitted light.

To verify that the SPE package shown in FIG. 13 provides higher light output and luminous efficacy, an experiment was conducted with twelve conventional high-flux LEDs, six 3 W blue and six 3 W white, obtained from the same manufacturer. A commercial optic that fit the profile requirements of the SPE package was found, and several were acquired for experimentation with the LEDs. Although this optical element did not have the desired geometry shown in FIG. 13 to extract most of the backscattered light, it was sufficient to verify the hypothesis. The top flat portion of the experiment's secondary optic was coated with a predetermined amount of YAG:Ce phosphor. The required phosphor density was determined in a separate experiment by systematically varying the amount of phosphor density, analyzing the resulting chromaticity, and selecting the density that produced a chromaticity close to that of the commercial white LED used in the experiment. To compare the performances of the two packaging concepts, the white LEDs were fitted with uncoated secondary optics. The light output and the spectrum of the commercial white LEDs were measured in an integrating sphere, and the current and the voltage required to power the LEDs were also measured. The same measurements were repeated for the SPE packages, which included blue LEDs fitted with phosphor-coated secondary optics, as shown in FIG. 13.

The average luminous flux and the corresponding average efficacy for the SPE LED packages were found to be 90.7 lm and 36.3 lm/W, respectively. The average luminous flux and the corresponding average efficacy for the typical white LED packages were 56.5 lm and 22.6 lm/W, respectively. Therefore, the SPE LED packages on average had 61% more light output and 61% higher luminous efficacy. The variation of luminous flux and corresponding efficacy between similar LEDs was small, with a standard deviation of less than 4%. The SPE packages consistently had higher lumen output and higher efficacy compared with the typical conventional white LED packages.

The impact of current on light output and efficacy was also measured on two LED packages, one typical white LED and one SPE package. These two LEDs were subjected to the same light output measurement procedure, but their input current was decreased from 700 mA to 50 mA in several steps, and the corresponding photometric and electrical data were gathered. At very low currents, the SPE package exceeded 80 lm/W, compared to 54 lm/W for the conventional package.

With the SPE package, the backscattered photons are extracted before they are absorbed by the components within the LED. It is essential that the phosphor layer be placed farther away from the die, and the backscattered photons be extracted before they undergo multiple reflections within the package. Moving the phosphor away from the die has an additional benefit: the life of the white LED is also be improved, as demonstrated in an earlier paper (Narendran, N., Y. Gu, J. P. Freyssinier, H. Yu, and L. Deng. 2004. Solid-state lighting: Failure analysis of white LEDs. Journal of Crystal Growth 268 (3-4): 449-456).

An alternate method of the present invention to recover a portion of the backscattered light is to coat the sides of the secondary optics with a reflective material, as shown in FIGS. 5A and 5B. Although the efficacy may improve compared to a conventional white LED package, the gain is not as much, because the backscattered light bounces back and forth between the phosphor layer and the reflectors, and a good portion of this light is absorbed and lost as heat. A drawback of this method is by increasing the path length of the short-wavelength light traveling through the surrounding epoxy material, the epoxy degrades faster and thus shortens the useful life of the white LED.

It will be understood that the geometry of the SPE package shown in FIG. 13 is not limited to this specific shape. Alternate shapes may be used to recover the backscattered photons more efficiently, while addressing other design concerns, such as color and life. As one example, in the configuration of FIG. 13, the inventors discovered that a preferred size for the top surface diameter is about 20 mm and a preferred size for the height is about 11 mm.

In summary, the present invention recovers the backscattered light from the phosphor layer. In addition, the overall light output and the corresponding luminous efficacy of a white LED may be increased significantly compared to a conventional white LED. At low currents, the SPE method shows over 80 lm/W white light with a chromaticity very close to the blackbody locus.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A light emitting apparatus comprising:
a source of light for emitting light;
a down conversion material receiving the emitted light and converting the emitted light into transmitted light and backward transmitted light; and
an optic device, having a first end proximal the radiation source and a second end distal the radiation source, the proximal end of the optic device having a width smaller that a width of the distal end, disposed between the source of light and the down conversion material, having at least one transparent side wall absent the down conversion material, configured to receive the backward transmitted light and transfer the backward transmitted light outside of the optic device through the at least one transparent side wall.

2. The light emitting apparatus of claim 1, wherein the source of light is a semiconductor light emitting diode, including one of a light emitting diode (LED), a laser diode (LD), or a resonant cavity light emitting diode (RCLED).

3. The light emitting apparatus of claim 1, wherein the down conversion material includes one of phosphor or other material for absorbing light in one spectral region and emitting light in another spectral region.

4. The light emitting apparatus of claim 1, wherein the optic device includes a light transmissive material.

5. The light emitting apparatus of claim 1, wherein the optic device includes at least one of a lens or a light guide having a light transmissive property.

6. The light emitting apparatus of claim 1, wherein the optic device is further configured to direct the light emitted from the source toward the down conversion material.

7. The light emitting apparatus of claim 1, wherein the optic device includes one of a lens or a light guide for directing substantially all of the light emitted from the source toward the down conversion material.

8. The light emitting apparatus of claim 1, wherein the source of light is disposed adjacent a first end of the optic device.

9. The light emitting apparatus of claim 8, wherein the down conversion material is disposed adjacent a second end of the optic device, the second end opposed to the first end.

10. The light emitting apparatus of claim 1, wherein the optic device is geometrically configured to transmit the backward transmitted light out of the optic device.

11. The light emitting apparatus of claim 1, wherein the source of light includes a plurality of semiconductor light emitters.

12. The light emitting apparatus of claim 9, wherein the down conversion material is deposited on a portion of the second end of the optic device.

13. The light emitting apparatus of claim 12, wherein the down conversion material is deposited to cover substantially the second end of the optic device.

14. The light emitting apparatus of claim 1, including a collecting device for collecting backward transmitted light which has been transferred out of the optic device.

15. The light emitting apparatus of claim 14, wherein the collecting device includes a reflector for directing the backward transmitted light that has been transferred out of the optic device away from the collecting device.

16. The light emitting apparatus of claim 15, wherein (a) the source of light is disposed adjacent a first end of the optic device, (b) the down conversion material is disposed adjacent a second end of the optic device, and (c) the first end of the optic device is disposed adjacent a first end of the reflector.

17. The light emitting apparatus of claim 1, wherein a geometrical shape of the optic device includes one of a cone, sphere, hyperbola, parabola, ellipse, pyramid, or box shaped.

18. The light emitting apparatus of claim 1, further including a reflector surrounding at least a portion of the optic device, and a light diffuser deposited on top of at least a portion of the reflector.

19. The light emitting apparatus of claim 18, wherein the down conversion material is disposed between the source of light and the reflector, and the down conversion material has a curved shape.

20. The light emitting apparatus of claim 1, wherein the width of the distal end of the optic device is about twice a height of the optic device.

21. The light emitting apparatus of claim 1, wherein the optic device is configured to transfer at least a portion of the backward transmitted light outside of the optic device through the at least one transparent side wall without the at least a portion of the backward transmitted light being reflected off the at least one transparent side wall.

22. A light emitting apparatus comprising:
a light transmissive cylindrical optic comprising at least two separate segments, each of the separate segments having a planar surface adjacent each other;
at least one light radiation source disposed adjacent an end of each of the at least two segments of the cylindrical optic; and
a down conversion material, disposed along a central longitudinal axis within the cylindrical optic, for at least one of transmitting or reflecting light transmitted by the light radiation source, the down conversion material adapted to allow passage of light from one segment into another segment of the cylindrical optic.

23. The light emitting apparatus of claim 22, wherein the light radiation source is a semiconductor light emitter, including one of a light emitting diode (LED), a laser diode (LD), or a resonant cavity light emitting diode (RCLED).

24. The light emitting apparatus of claim 22, where the light radiation source is disposed adjacent one lateral end of the cylindrical optic.

25. The light emitting device of claim 22, wherein the light radiation source includes first and second radiation sources, spaced from each other and both disposed adjacent one lateral end of the cylindrical optic.

26. The light emitting device of claim 22, where the down conversion material includes one of phosphor or other material for absorbing light in one spectral region and emitting light in another spectral region.

27. The light emitting device of claim 22, wherein the down conversion material is disposed substantially parallel to a longitudinal axis of the cylindrical optic.

28. The light emitting apparatus of claim 22, wherein the light radiation source includes at least one light source on each side of the down conversion material.

29. The light emitting apparatus of claim 28, wherein the light sources are mounted on at least one substrate.

30. The light emitting apparatus of claim 22, wherein the at least two separate segments are each substantially similar to each other.

31. The light emitting apparatus of claim 22, wherein the down conversion material is planar shaped.

32. The light emitting apparatus of claim 22, wherein the down conversion material has at least a first side for transmitting light and reflecting light.

33. The light emitting apparatus of claim 32, wherein the down conversion material has at least a second side for transmitting light and reflecting light.

34. A light emitting apparatus comprising:
a source of light for emitting light;
a down conversion material receiving the emitted light and converting the emitted light into transmitted light and backward transmitted light; and
an optic device, having a first end proximal the radiation source and a second end distal the radiation source, the proximal end of the optic device having a width smaller that a width of the distal end, disposed between the source of light and the down conversion material, having at least one transparent side wall absent the down conversion material, configured to receive the backward transmitted light and transfer substantially all of the backward transmitted light outside of the optic device through the at least one transparent side wall.

35. The light emitting apparatus of claim 34, wherein at least approximately 84% of the combined transmitted light and backward transmitted light is transferred outside of the optic device.

36. A light emitting apparatus comprising:
a source of light for emitting light;
a down conversion material receiving the emitted light and converting the emitted light into transmitted light and backward transmitted light; and
an optic device, having a first end proximal the radiation source and a second end distal the radiation source, the proximal end of the optic device having a width smaller that a width of the distal end, disposed between the source of light and the down conversion material, having at least one transparent side wall, configured to receive the backward transmitted light and transfer the backward transmitted light outside of the optic device between the source of light and the down conversion material through the at least one transparent side wall without passing through the down conversion material.

37. The light emitting apparatus of claim 22, wherein the cylindrical optic receives the light reflected by the down conversion material and transfers the reflected light outside of the cylindrical optic.

38. The light emitting apparatus of claim 22, wherein each segment Of the at least two separate segments of the cylindrical optic is comprised of a solid material.

39. A light emitting apparatus comprising:
a light transmissive cylindrical optic comprising at least two separate segments, each of the separate segments having a planar surface adjacent each other;
at least one light radiation source disposed adjacent an end of the cylindrical optic; and
a down conversion material, disposed along a central longitudinal axis within the cylindrical optic, for at least one of transmitting or reflecting light transmitted by the light radiation source,
wherein a first segment of the at least two separate segments of the cylindrical optic has a first surface, a second segment of the at least two separate segments of the cylindrical optic has a second surface, and the down conversion material is disposed between the first surface and the second surface.

40. The light emitting apparatus of claim 39, wherein the first surface is a first planar surface and the second surface is a second planar surface.

\* \* \* \* \*